(12) United States Patent
Brunschwiler et al.

(10) Patent No.: US 9,230,832 B2
(45) Date of Patent: Jan. 5, 2016

(54) METHOD FOR MANUFACTURING A FILLED CAVITY BETWEEN A FIRST AND A SECOND SURFACE

(71) Applicant: International Business Machines Corporation, Armonk, NY (US)

(72) Inventors: Thomas J. Brunschwiler, Thalwil (CH); Stephan Paredes, Zurich (CH); Gerd Schlottig, Waldegg (CH); Heiko Wolf, Pfaeffikon (CH)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 8 days.

(21) Appl. No.: 14/195,077

(22) Filed: Mar. 3, 2014

(65) Prior Publication Data
US 2015/0249022 A1    Sep. 3, 2015

(51) Int. Cl.
| | |
|---|---|
| *H01L 23/48* | (2006.01) |
| *H01L 21/02* | (2006.01) |
| *H01L 23/488* | (2006.01) |
| *H01L 21/56* | (2006.01) |
| *H01L 23/00* | (2006.01) |

(52) U.S. Cl.
CPC .............. *H01L 21/563* (2013.01); *H01L 24/11* (2013.01); *H01L 24/12* (2013.01); *H01L 24/13* (2013.01); *H01L 24/14* (2013.01); *H01L 24/16* (2013.01); *H01L 24/29* (2013.01); *H01L 24/32* (2013.01); *H01L 24/83* (2013.01)

(58) Field of Classification Search
CPC ................... H01L 24/10–24/17; H01L 24/81; H01L 24/29; H01L 24/32; H01L 24/83
See application file for complete search history.

(56) References Cited

U.S. PATENT DOCUMENTS

| | | | | |
|---|---|---|---|---|
| 6,297,559 | B1 * | 10/2001 | Call .................... | H01L 21/4853 228/180.22 |
| 2002/0027294 | A1 * | 3/2002 | Neuhaus .......... | G06K 19/07752 257/778 |
| 2007/0216023 | A1 * | 9/2007 | Nakatani .............. | B23K 1/0016 257/714 |
| 2008/0011402 | A1 * | 1/2008 | Shiraishi ............... | H01L 21/563 156/50 |
| 2008/0265437 | A1 * | 10/2008 | Shiraishi ............... | H01L 21/563 257/778 |
| 2008/0284046 | A1 * | 11/2008 | Karashima .......... | H01L 21/6835 257/778 |
| 2009/0008776 | A1 * | 1/2009 | Kitae ................... | B23K 1/0016 257/737 |
| 2009/0078746 | A1 * | 3/2009 | Karashima ............... | H01L 24/11 228/248.1 |
| 2009/0102064 | A1 * | 4/2009 | Sawada ................... | H01L 24/11 257/778 |

(Continued)

FOREIGN PATENT DOCUMENTS

WO    WO 2009/098831    8/2009

*Primary Examiner* — Marvin Payen
*Assistant Examiner* — Jeremy Joy
(74) *Attorney, Agent, or Firm* — Jeff Tang

(57) ABSTRACT

A method for manufacturing a filled cavity between a first surface and a second surface. The steps of the method include: providing a first surface and a second surface; applying on the first surface and/or the second surface a filling material that has a carrier fluid and necking particles; providing spacer elements for defining a width of a cavity between the first and second surfaces; bringing the first and second surfaces together to deform the filling material such that at least one spacer element is held between the first and second surfaces; and removing the carrier fluid such that necking particles attach in a contact region of at least one spacer element with the first surface or the second surface to form necks.

14 Claims, 6 Drawing Sheets

(56) References Cited

U.S. PATENT DOCUMENTS

2009/0115071 A1* 5/2009 Karashima .............. H01L 24/16
257/778
2010/0001411 A1* 1/2010 Sawada .................. H01L 24/11
257/778
2010/0295173 A1 11/2010 Chang et al.
2012/0261819 A1* 10/2012 Brunschwiler ....... H01L 21/563
257/738

* cited by examiner

METHOD FOR MANUFACTURING A FILLED CAVITY BETWEEN A FIRST AND A SECOND SURFACE

BACKGROUND OF THE INVENTION

1. Field of the Invention

This disclosure relates to methods for manufacturing a filled gap region or cavity between two surfaces, as for example, an underfill in flip-chip packages, die attachments or die stacks.

2. Description of Related Art

In modern electronic devices, substantial gains in performance are continuously achieved by means of circuit miniaturization and by the integration of single-package multi-functional chips. The scalability and performance of such electronic devices are related to their ability to dissipate heat. In typical flip-chip arrangements, one integrated circuit (IC) surface is used for heat removal through a heat sink, while the other for power delivery and data communication. Power is delivered throughout solder balls attached to electrical pads on the IC chip that are reflowed and coupled to the main circuit board.

To minimize mechanical stress in the solder balls and to protect them electrically, mechanically, and chemically, the gap region between an IC chip and board, created due to the presence of solder balls, is conventionally filled with electrically non-conductive materials known as underfills. Current efforts towards 3D chip integration, with solder balls as electrical connection between silicon dies, demand high thermally conductive underfills to efficiently dissipate the heat of lower dies to the heat removal embodiment attached at the chip stack backside. Some flip-chip on-board applications do also benefit from efficient heat dissipation from the semiconductor die into the board. Hence, thermal underfills between semiconductor and board are desirable. Additionally, electric joints between circuit board pads and metallic coatings at chips should be flexibly produced.

Conventional thermal underfills may consist of a curable matrix (e.g. epoxy resin) loaded with silica fillers, which have a similar thermal expansion coefficient (CTE) to that of the silicon. Currently, the requirement of matching CTE with the solder balls dictates the type, and volumetric fill of fillers to be employed in a given underfill. For thermal underfills the thermal conductivity of filler materials which are used to increase the thermal contact and enhance heat dissipation between connected surfaces should be high. Therefore, $Al_2O_3$, AlN, BN or other metal and nonmetal materials are used.

Conventionally, an underfill material can be dispensed into a gap between chips or a flip-chip and a substrate by injecting the filling material along the lateral sides of the gap. U.S. Pat. No. 6,214,635 describes a method and an apparatus for underfilling the gap between a semiconductor device and a substrate by inclining the substrate and semiconductor and introducing filling material along a side wall or through one central hole in the substrate. The underfill then flows into the gap and forms an underfill.

SUMMARY OF THE INVENTION

Accordingly, the present invention provides a method for manufacturing a filled cavity between a first surface and a second surface. The method includes the steps of: providing a first surface and a second surface; applying a filling material including a carrier fluid and necking particles on the first surface and/or the second surface; providing spacer elements for defining a width of a cavity between the first surface and the second surface; bringing the first and second surfaces together to deform the filling material such that at least one spacer element holds between the first surface and the second surface; and removing the carrier fluid such that the necking particles attach in a contact region of at least one spacer element to the first surface or the second surface, thereby forming necks.

DETAILED DESCRIPTION OF THE PREFERRED EMBODIMENTS

Figure 1:
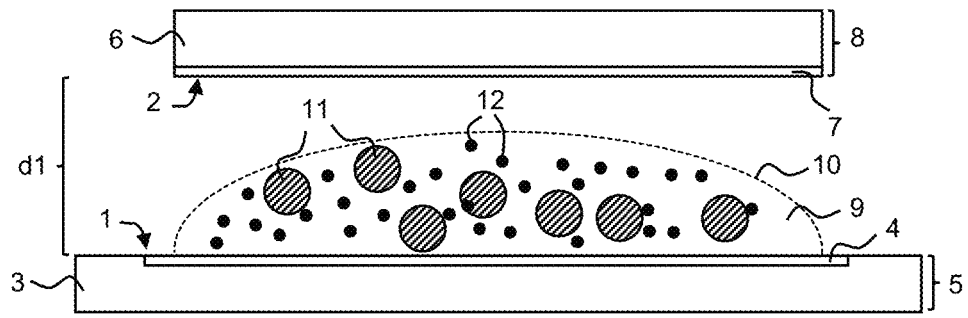
FIGS. 1-5 show an embodiment of a filled cavity between spaced surfaces and illustrate method steps involved in manufacturing a filled cavity.

Certain embodiments of the presented method for manufacturing a filled cavity between spaced surfaces may comprise individual or combined features, method steps or aspects as mentioned above or below with respect to exemplary embodiments.

In the following, embodiments of methods and devices relating to the manufacture of fillings in a cavity are described with reference to the enclosed drawings. Like or functionally like elements in the drawings have been allotted the same reference characters, if not otherwise indicated.

The term "filler material" refers to a viscous material or material composition that can be dispersed in a cavity or gap. One can also refer to a filling agent, a paste, or a liquid. The viscous filler material essentially forms a closed flow front that expands with the volume of the material. The filling material may include a carrier fluid having suspended particles. Hence, the material composition can have a plurality of ingredients having different phases, e.g. liquid and/or solid particles.

As used herein, the term "spacer elements" refers to objects of same or similar spatial extension that are suitable for spacing or separating two surfaces at a distance corresponding to their spatial dimension. "Spacer particles" can essentially be of any shape but should have the same "diameter" within a reasonable tolerance. The spacer particles can be small pieces or bits of a solid material.

A "cavity" or gap between two surfaces, e.g. in a chip stack is a volume between two surfaces that are spaced with respect to each other. The volume usually has a much larger lateral extension that its height, width, or thickness. The cavity can have lateral sides that are open. However, the sides can be limited by side-walls or other structural elements as well.

The term "holding between" is intended to include that two elements are attached to each other, and adhesive forces hold them essentially in place. For example, the spacer particle is held between the two surfaces and serves as a spacing means that is sandwiched between the surfaces.

It is understood that, in the following, only sections or parts of cavity structures are shown. In actual embodiments the depicted structures would extend through the paper plane and continue further than shown in the schematic drawings. By approaching the first and second surfaces, or in other words, bringing the two surfaces together, a space gap or cavity is formed. The distance between the surfaces in their end position is defined by the size of the spacer elements that arrange between the surfaces and, for example, are held or locked between the surfaces. In the process of approaching or bringing the surfaces together, the filling material which can be a viscous material is deformed or squeezed and distributes itself in the narrowing gap. A plurality of spacer elements can touch the two surfaces.

Contemporaneously, with forming the gap region or cavity, the joint or filling can be realized. For example, the spacer elements can realize an electric or thermal contact between the surfaces. The necking particles have a smaller dimension than the spacer elements and, for example, arrange with the help of capillary forces at the contact regions between the spacer elements and the surfaces. This is, for example, because the surface of the carrier fluid shrinks when the carrier fluid is removed from the cavity by evaporation such that the tiny necking particles are enclosed by the carrier fluid remaining in the process of removing it. With respect to the surface tension of the carrier fluid, the contact regions are preferred and the necking particles assemble there. A capillary bridging process can be used for the necking particles.

In one embodiment of the present method, the filling material includes a suspension composed of the carrier fluid and the necking particles, where the necking particles are adapted to attach to the first and/or second surface and at least one spacer element around the contact regions for forming necks.

The carrier fluid can be a liquid, and the necking particles are nanoparticles, in particular metallic particles. A suspension, in terms of a viscous filling material or fluid, can easily be applied to one of the two surfaces and then squeezed into place by a relative movement of the surfaces with respect to each other.

In another embodiment, the filling material includes a suspension composed of a carrier fluid and spacer particles where the spacer particles have a predetermined diameter defining the width or height of the cavity. Spacer particles can have a spherical shape and essentially have the same dimension such that essentially parallel surfaces define the gap or cavity region spaced by the spacer particles. The spacer particles can have any shape suitable for spacing two surfaces.

Preferably, the viscous filling material is used and can include the carrier fluid, necking particles, and the spacer particles. Further, different types of necking particles for enhancing an attachment or adhesion between necking particles and/or spacer elements can be contemplated.

In another embodiment, the step of removing the carrier fluid includes evaporating the carrier fluid. By evaporating, the volume of the carrier fluid shrinks, thereby reducing its outer surface area such that the necking particles are transported into place to form the necks. The spacer particles are fixed in place by being held between the two surfaces.

The formation of the necks can be enhanced by applying magnetic and/or electric fields and using appropriate particles. For example, the spacer particles and/or the necking particles can include a ferromagnetic material, for example in terms of a coating or as bulk.

Another embodiment of the present invention envisions the method further including the step of annealing the necking particles. In particular, electrical joints can be made using metal spacer and necking particles. The annealing temperature is chosen in accordance with a material for necking particles. Through the annealing process, the combination of spacer elements with necks including the necking particles builds a robust joint between the two surfaces and holding them in place. Further, the spacer elements or spacer particles can form high quality electrical joints and a mechanically stable structure.

The method can include the step of providing a polymer or additional nanoparticles in the carrier fluid for enhancing an adhesion between necking particles and/or spacer elements. For example, additional necking particles can improve the tackiness of the spacer particles and/or the necking particles. By choosing necking particle mixtures, the Young's modulus of the spacing elements and necking particles can be adjusted.

Another embodiment of the present of invention envisions the method further including the step of back-filling voids in the cavity between spacer particles and necking particles with a resin and/or adhesive.

In another embodiment, the spacer elements are attached to or integratedly formed with the first surface or the second surface. For example, the surfaces can be structured as to show protrusions or bars or structures that when attached to each other lead to a distance between the surfaces and therefore a cavity or gap.

The spacer elements can be adapted to define a width or distance between the surfaces between 20 μm and 100 μm. Preferably, the spacer elements define a width between 20 and 50 μm. Likewise, the necking particles having a diameter between 10 nm and 300 nm can be contemplated. Generally, the necking particles have a smaller diameter than spacer particles. For example, a ratio between the diameter of the spacer particles and the necking particles is 100 nm, and preferably, 400 nm. The spacer elements can be chosen from the group of solder balls, electrically conducting particles, copper pillars, copper particles or coated particles.

In another embodiment, the method can further include the step of providing a conducting pad or metallization layer on at least one of the first and/or second surface. For example, a pad can be applied to a circuit board and a metallization to a chip die.

In an additional embodiment, after forming the necks, the method can also include the step of filling void regions between the spacer elements with a further filler material. The further filler material can be a resin, for example, for making the connection between the two surfaces even more mechanically robust. The further filler material can include bridging particles and additional necking particles in a carrier fluid. Preferably, the bridging particles have a smaller diameter than the width and a diameter larger than a diameter of the necking particles and/or the additional necking particles.

In an optional process of back-filling, the bridging particles remain in the void regions and can form percolation paths between the respective upper and lower surfaces. The additional necking particles then can form necks around the contact points between the bridging particles themselves or the bridging particles and the first or second surface. As a result, an additional robust attachment of the first and the second surface is obtained with the option to provide improved heat conduction.

In another embodiment the present invention, the step of providing a barrier section on at least one of the first or second surface is performed. The barrier sections separate the first region and the second region on at least one of the first or second surfaces. The barrier section is implemented to avoid merging with viscous filler material that is placed in the separated regions. For example, the barrier section can be a recess in the first or second surface. The recess, or trench, can create the effect that the two separated regions are separately mechanically and/or electrically coupled to the opposite surface using specific materials.

In another embodiment, the barrier section is a projection on at least one of the first or second surfaces. A projection, for example, would prevent a flow of viscous fluid like carrier fluid or filling material from one region to the other.

For example, this can occur by applying a first filling material to the first region, and applying a second filling material to the second region. The first and the second filling material include different spacer particles and/or necking particles. Therefore, one can determine the function of the filling materials by choosing appropriate material properties of the spacer particles and/or necking particles for the different filling materials. For example, the first and/or second surface are part of a chip, a circuit board, a solder pad, a metallization layer, a laminate, a die, a solder-resist layer or a protective coating. One can contemplate other surfaces that need to be attached to each other and have different thermal expansion characteristics.

FIGS. 1-5 show schematic diagrams of the steps involved in the manufacture of a filled cavity or gap between two surfaces. As shown in FIG. 1, first surface 1 and second surface 2 are provided. First surface 1 and second surface 2 can be part of laminates, chips, dies, circuit boards or the like.

In the embodiment shown in FIG. 1, first surface 1 is part of laminate 3 having a metallic pad 4. In the orientation of FIG. 1, the lower surface structure can be part of board 5, which can be a dielectric board, and is provided with pads 4. The upper surface structure is, for example, chip 8 having die 6 with metallization layer 7. Pad 4 can be made of copper and metallization layer 7 can be made of nickel and gold. However, one can contemplate other materials in constructing these elements.

An electrical joint can be formed between metallization layer 2 and pad 4. In FIG. 1, conducting elements 4, 7 face each other at distance d1. In a first step, a viscous filler material is applied to first surface 1. The viscous filler material has a micro-nano suspension in terms of carrier liquid 9 having dispersed microparticles 11 and necking particles 12. Microparticles 11 serve as spacer elements or spacer particles and define the minimum distance between first surface 1 and second surface 2, after assembly. For example, the viscous filler material is dispensed onto first surface 1 by an extruder or syringe. Filler particles 11 and nanoparticles, or necking particles 12, are composed of electrically conductive material. For example, necking particles 12 can be made of copper or silver, and spacer particles 11 can be made of a copper alloy.

Figure 2:
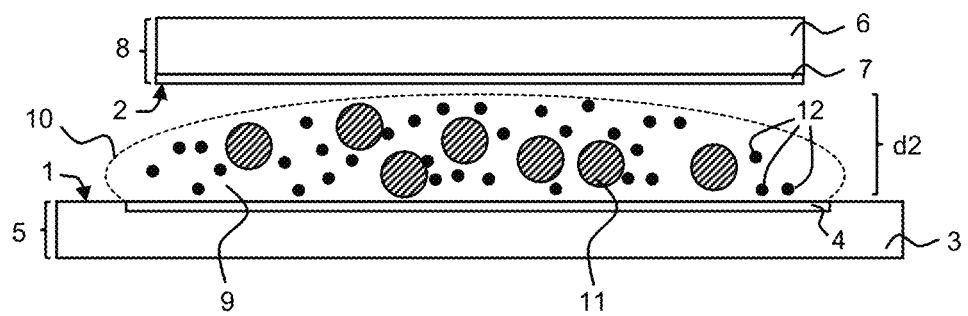
Figure 3:
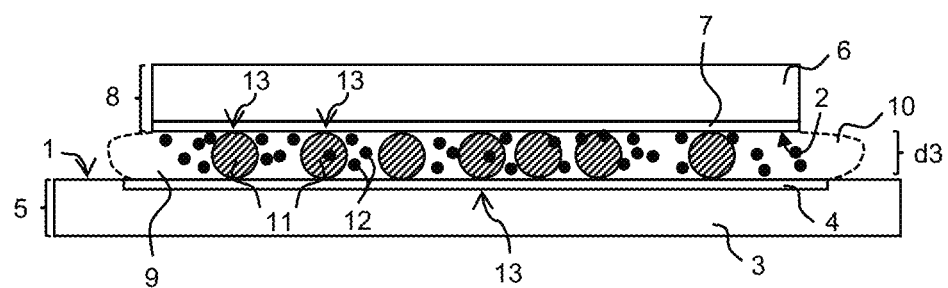

Next, first surface 1 and second surface 2 are brought together with each other as shown in FIG. 2. For example, in a production process, chip 8 is picked up and placed on top of pad 4 included in laminate 3 structure. By reducing distance d2 of the two opposite surfaces, first surface 1 and second surface 2, the viscous filler material or the suspension is deformed or squeezed away. As a result, when the distances are further reduced, as shown in FIG. 3, spacer particles 11 define distance d3 between the two surfaces, first surface 1 and second surface 2. The combination of carrier liquid 9, microparticles 11, and necking particles 12 can be thought of as a suspension. The suspension is deformed as a consequence of the approaching of the two surfaces. While, as shown in FIG. 3, spacer particles 11 become attached to first surface 1 and second surface 2, necking particles 12 are still dispersed in carrier fluid 9. Contact regions 13 are indicated where spacer particles 11 touch first surface 1 and second surface 2, and keep them at distance d3 apart. Hence, the dimensions of spacer particles 11 define the gap, width, or height.

Figure 4:
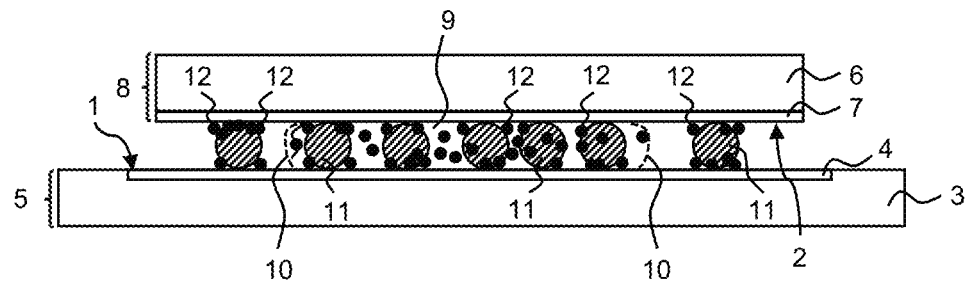
Figure 5:
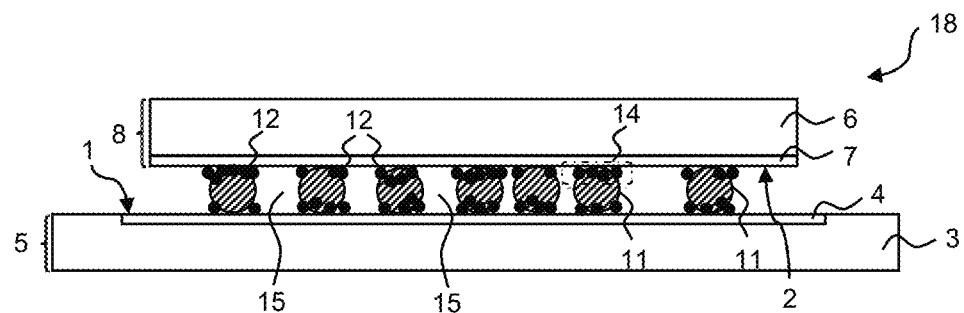
Figure 6:
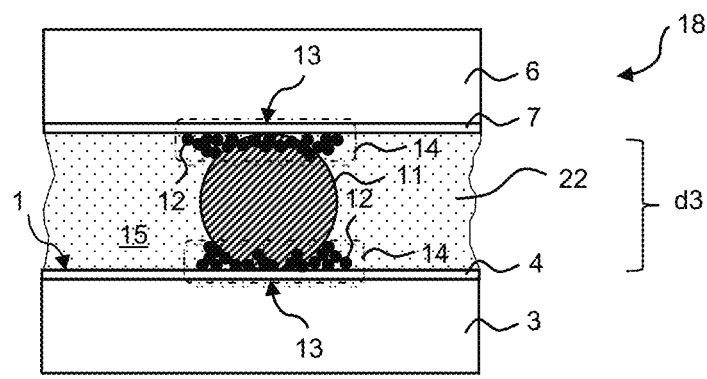
FIG. 6 shows a detailed view of the embodiments of FIGS. 1-5 for illustrating a necking process.

In a next step, carrier fluid 9 is removed from the gap by increasing the temperature. For example, the carrier fluid is evaporated. This is shown in FIG. 4. By evaporating carrier fluid 9, surface 10 of carrier fluid 9 shrinks. Due to the surface tension of carrier fluid 9, the lowest energy regions when a carrier fluid separates into droplets is in contact regions 13. As a result, necking particles 12 are transported to these locations and form neck-like structures as shown in the left and right spacer particles in FIG. 4. During the process of removing the carrier fluid by evaporation, necks are formed close to contact regions 13, as shown in FIG. 5, and potentially void regions 15 in the space between spacer particles 11. FIG. 6 shows a detailed view of one spacer particle 11 that has an upper and a lower necking 14 close to contact regions 13 with first surface 1 or second surface 2, respectively. The necking provides improved electrical and thermal conductivity because many percolation paths reach through the electrically conducting nanoparticles from the electrically conducting spacer particle 11 to the respective surfaces, first surface 1 and second surface 2, of pad 4 and metallization layer 7. Optionally, a back-filling process is included, and as a result, resin 22 fills void regions 15. The resulting structure can be called stacked surface structure 18.

In an optional annealing step, the electrical joints between pad 4 and metallization layer 7 in terms of spacer particles 11 and necks 14 is further improved. As a result, a reliable electrical coupling is obtained. The annealing temperature can be around 150° C. which is still below a solder reflow temperature. One can contemplate the use of copper-type micro-particles as spacer particles 11 and also copper-comprising nanoparticles as necking particles 12. One can also contemplate the use of a mixture of nanoparticles so that necking particles 12 stick better to each other.

Figure 7:
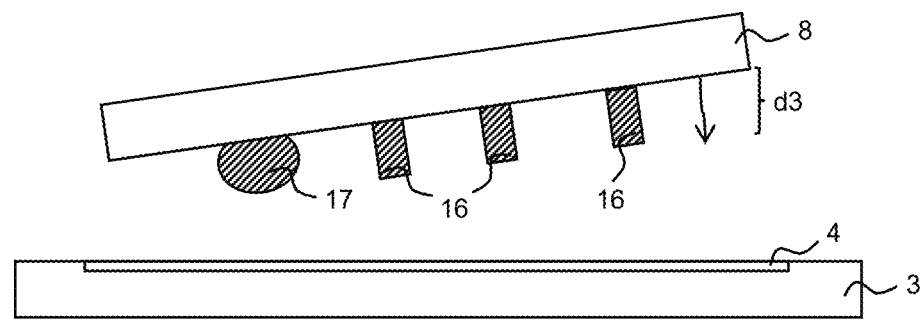
FIGS. 7 and 8 show another embodiment of a filled cavity between spaced surfaces and illustrate method steps involved in manufacturing the filled cavity.
Figure 8:
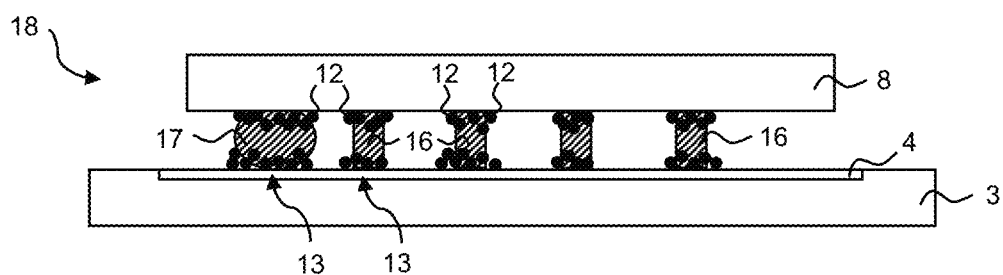

Instead of dispersing the spacer particles in the carrier fluid, one can also contemplate the structuring of one of the two surfaces to include spacing means. FIGS. 7 and 8 show another embodiment of the method of the present invention and stacked surface structure 18.

FIG. 7 shows a lower surface structure including laminate 3 and pad 4. Pad 4 is to be coupled with chip 8 that has spacing means, for example, solder ball 17, or other spacer elements 16 defining distance d3 for a gap between laminate 3 and chip 8.

FIG. 8 shows stacked surface structure 18 that is obtained along the lines of the embodiment shown in FIGS. 1-5. At contact region 13, between spacer element 16 and solder ball 17 and metal pad 4, necks composed of nanoparticles have formed. Similarly, at the corners where spacer element 16 and solder ball 17 merge with chip 8, necking occurs because the nanoparticles agglomerate by capillary forces there.

Figure 9:
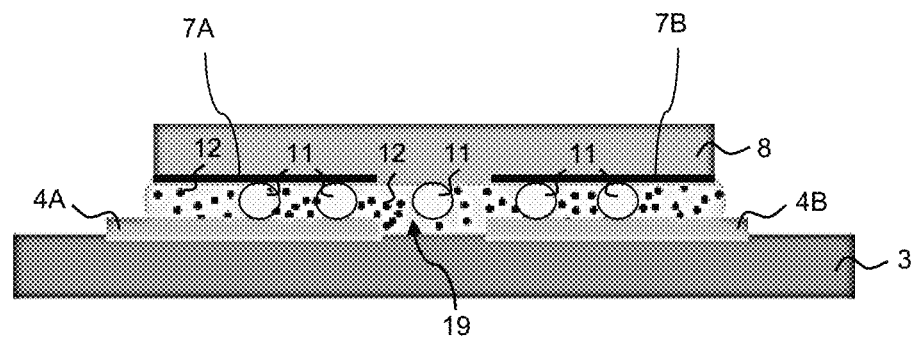
FIGS. 9 and 10 show another embodiment of a filled cavity between spaced surfaces and illustrate method steps involved in manufacturing the filled cavity.
Figure 10:
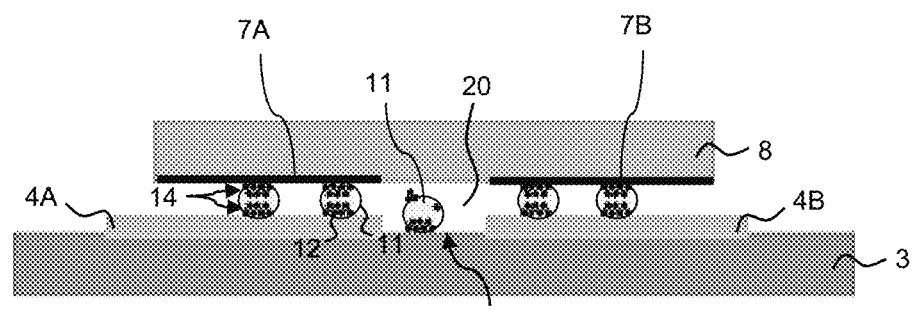

FIGS. 9 and 10 show another embodiment of a cavity between spaced surfaces and illustrate method steps involved in manufacturing the filled cavity. In comparison with the configuration shown in FIG. 1-6, the laminate has two pads 4A, 4B which are separated by trench 19.

FIG. 9 shows a configuration that corresponds to what is shown in FIG. 3 with respect to the filling method. Chip 8 is picked and placed onto the filler material including a suspension of spacer particles 11 and necking particles 12 in carrier fluid 9. In trench 19 between the two pads 4A and 4B, the distance between the surfaces of chip 8 and laminate 3 is larger than where the two pads 4A and 4B face the chip metallizations 7A and 7B. When carrier fluid 9 is removed by evaporation, spacer balls, or spacer particles 11, that are in trench region 19 cannot couple laminate 3 with chip 8. Hence, the electrical joint is limited to the specific regions where pads 4A and 4B face metallization 7A and 7B of chip 8. By structuring one of the surfaces, one can realize specific arrangements of the electrical thermal coupling between the surfaces.

Figure 11:
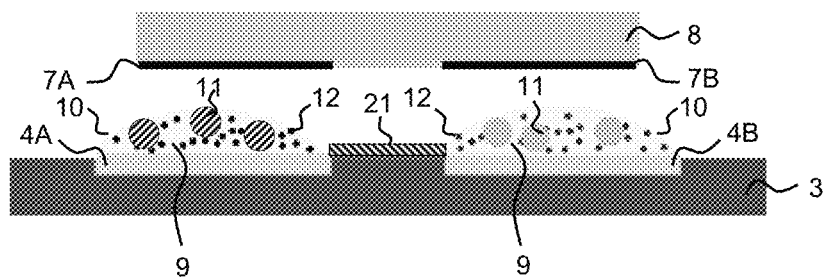
FIGS. 11-14 show another embodiment of a filled cavity between spaced surfaces and illustrate method steps involved in manufacturing a filled cavity involving a backfilling process.
Figure 12:
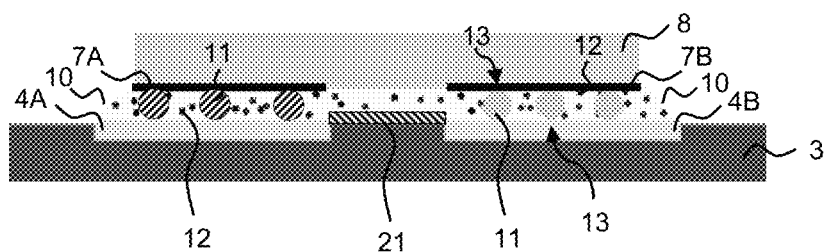

FIGS. 11-14 show another embodiment of a filled cavity between spaced surfaces. FIG. 11 shows the upper chip die 6 having two metallizations 7A and 7B. The lower laminate 3 has two pads 4A and 4B which are separated from each other by a protrusion from laminate 3. Barrier section 21, which can be in the form of a projection or protrusion, has a higher level with respect to laminate 3 than the two pads 4A and 4B. Barrier section 21 forms a wall. Barrier section 21 allows for the application of different carrier or filler materials in the orientation of FIGS. 11-13 of the left-hand side and the right-hand side of pad 4A and 4B, respectively. For example, a first configuration of carrier fluid 9, spacer particles 11, and necking particles 12 is applied to the left-hand side of pad 4A, and the second configuration of carrier fluid 9, spacer particles 11, necking particles 12 is applied to the right-hand side of pad 4B. The spacer particles can have different physical properties on the left, shown as hatched, from the right, shown in grey. When chip 8 is lowered toward laminate 3 as shown in FIG. 12, no spacer particles can move in barrier section 21 because they are blocked at the edge of barrier section 21. Instead, a first joint, created by spacer particles 11 on the left-hand side, and a second joint, created by spacer particles 11 on the right-hand side, are formed.

Figure 13:
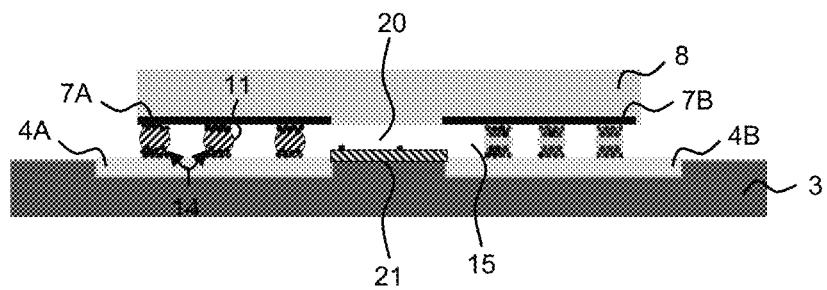

FIG. 13 shows the configuration after the removing of the two carrier fluids on the left- and right-hand side. Void 20 remains between the two electrically and/or thermally coupled surfaces, i.e. the left-hand metallization layer 7A and pad 4A and the right-hand metallization layer 7B and pad 4B, respectively.

Figure 14:
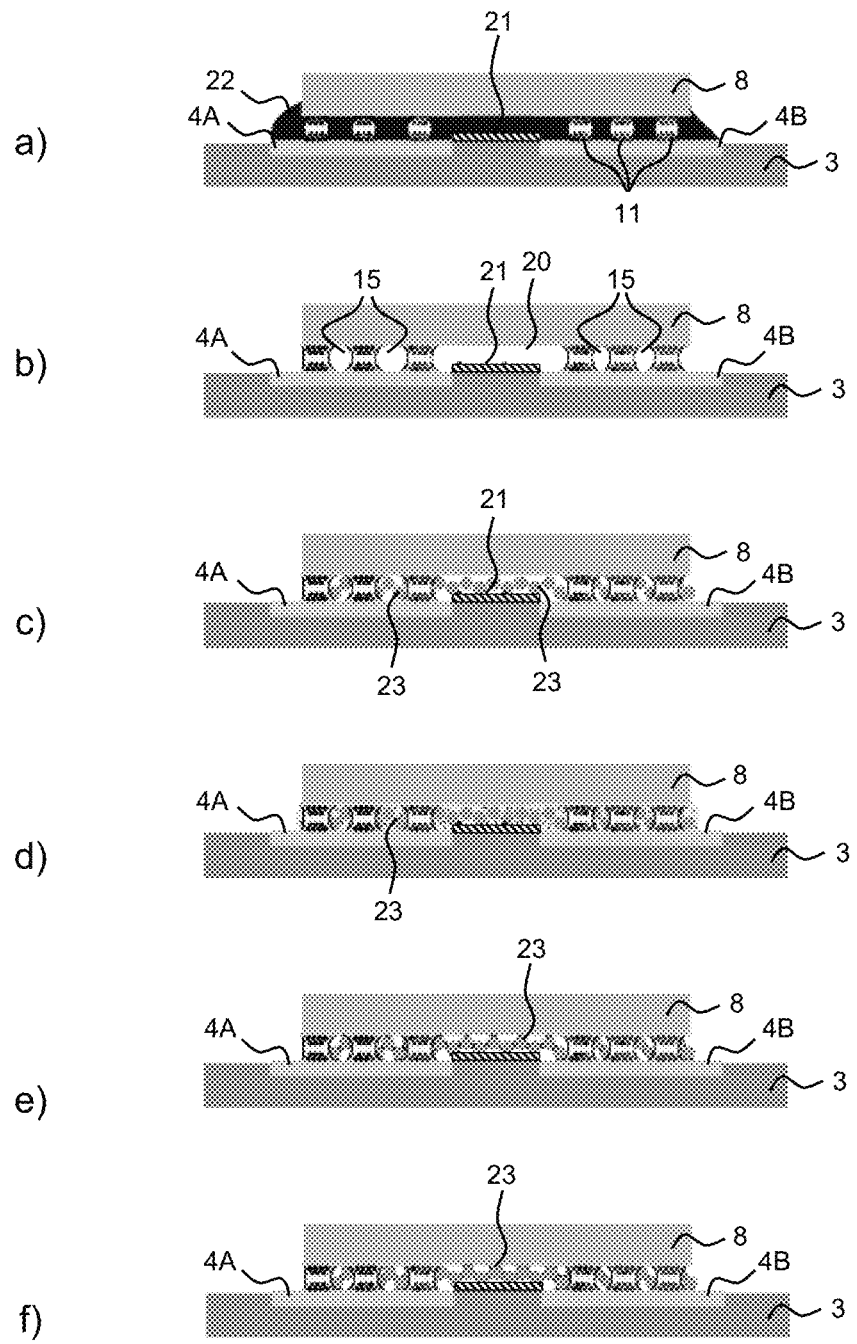
Figure 15:
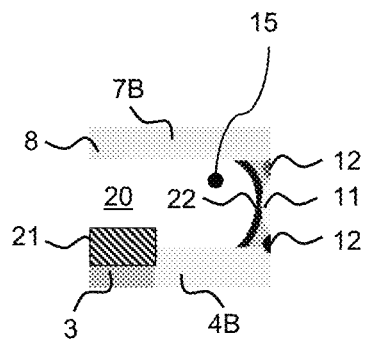
FIGS. 15-19 show detailed views of the embodiments of FIGS. 11-14.

In order to provide additional mechanical stabilization, a back-filling can be applied. For example, FIG. 6 shows the process of back-filling the void regions between spacer balls. Another back-filling process is illustrated in FIG. 14. For example, a diluted resin 22 can be inserted into voids 15, 20 as shown in FIG. 14a. After evaporation of the solvent, the resin, depending on its viscosity, will attach at the inner surfaces of the cavity and also surround spacer balls 11. A detailed view is shown in FIG. 15 where the section of the left-hand solder ball of the right-hand pad 4B is shown. Another back-filling process includes the filling of voids 15, 20 with resin only, followed by a rinsing step, leaving a polymer layer at the inner surfaces of the cavity and also surrounding spacer balls 11. Finally, resin 22 can be cured resulting in a mechanically rigid layer surrounding spacer ball 11 and necks. In principle, other surface areas can be covered in the cavity. FIG. 14b shows the remaining voids 15, 20 in the surface stack structure.

Figure 16:
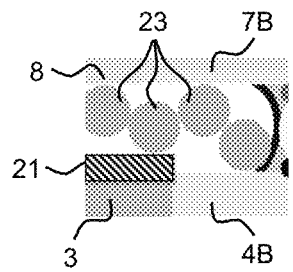
Figure 17:
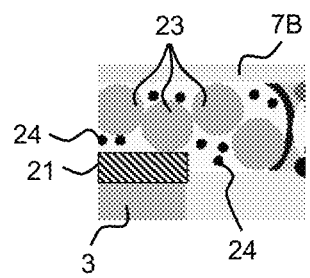

In another step, as illustrated in FIG. 14c, fillings, or bridging particles 23, are inserted into the cavities or voids. It is understood that the following steps may be performed without the steps shown in FIGS. 14a and 14b. Bridging particles 23 have a smaller diameter than the cavity width, but a significantly larger diameter than necking particles 12. FIG. 16 again shows a detailed partial sectional view of the left-hand spacer particle 11 and the right-hand pad 4B. The additional bridging particles 23 are attached to each other or touch each other at contact points. Next, a nanoparticle suspension is inserted into the cavity. The suspension can carry several types of nanoparticles having different functions as mentioned above. This is illustrated in FIG. 14d, and in more detail in FIG. 17. Necking particles 24 are suspended in a liquid and will arrange close to the contact regions of bridging particles 23 when the carrier liquid is evaporated. The process is similar to the necking process illustrated with respect to the spacer particles and the contact regions with the surfaces.

Figure 18:
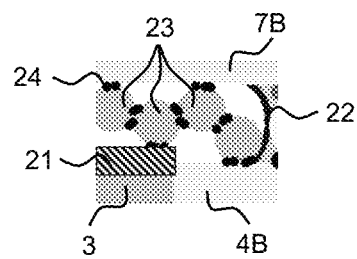
Figure 19:
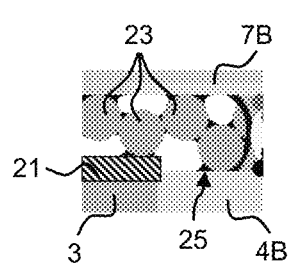

FIG. 18 shows the nano-necking particles 24 in place at the contacts where bridging particles 23 are attached to each other or touch with the upper or lower surfaces of pad 4B and metallization 7B, respectively. In an annealing step, the secondary necks formed by necking particles 24 are enhanced. This is illustrated in FIG. 14f and FIG. 19, respectively. During the annealing step, the necks become more pronounced and a network of percolated filler particles 23 leads to a further mechanical stabilization.

The proposed method for coupling surfaces leads to an easy-to-implement process by applying a suspension of a carrier liquid with spacer particles and necking particles to a first surface structure and placing a second surface onto the applied suspension thereby squeezing it and fixing the spacer particles between the two surfaces. Due to capillary forces, necks are formed that can be assisted by evaporation, air flow, or rinsing of the carrier liquid and an optional annealing step after the neck forms. The coupling of the surfaces is, for example, appropriate for power electronics or when dies have to be coupled to laminates. The coupling, in terms of joints by the spacer particles, can replace conventional solder processes when reliable electrical couplings are desired and improved mechanical stability can be achieved through a back-filling process.

We claim:

1. A method for manufacturing a filled cavity between a first surface and a second surface, the method comprising the steps of:
   providing a first surface and a second surface;
   applying a filling material, having a carrier fluid and necking particles, on the first surface and/or the second surface;
   providing spacer elements to define a width of a cavity between the first surface and the second surface;
   bringing the first surface and the second surface together to deform the filling material such that at least one spacer element is held between the first surface and the second surface;
   removing the carrier fluid such that necking particles attach in a contact region of at least one spacer element with the first surface or the second surface as to form necks; and
   filling void regions between the spacer elements with a further filler material:
   wherein the further filler material comprises a resin and/or an adhesive, bridging particles, and additional necking particles in a carrier fluid; and
   wherein the bridging particles have a smaller diameter than the width and larger than a diameter of the necking particles and/or the additional necking particles.

2. The method of claim 1, wherein the filling material has a suspension composed of the carrier fluid and the necking particles, wherein the necking particles are adapted to attach to the first and/or second surface and at least one spacer element around the contact regions for forming necks.

3. The method of claim 1, wherein the filing material comprises a suspension composed of the carrier fluid and spacer particles, wherein the spacer particles have a predetermined diameter defining the width of the cavity.

4. The method of claim 1, wherein the step of removing the carrier fluid includes evaporating or rinsing the carrier fluid.

5. The method of claim 1, further comprising the step of: annealing the necking particles.

6. The method of claim 1, further comprising: providing a polymer or additional nanoparticles in the carrier fluid for enhancing an adhesion between the necking particles and/or spacer elements.

7. The method of claim 1, wherein the spacer elements are attached to or integrally formed with the first surface or the second surface.

8. The method of claim 1, wherein the spacer elements are adapted to define a width between 20 micrometers and 100 micrometers.

9. The method of claim 1, wherein the necking particles have a diameter between 10 nanometers and 300 nanometers.

10. The method of claim 1, wherein the spacer elements are at least one of the group consisting of: solder balls, electrically conducting particles, copper particles, coated particles, copper pillars.

11. The method of claim 1, further comprising the step of: providing a conducting pad or a metallization layer on at least one of the first and/or the second surfaces.

12. A method for manufacturing a filled cavity between a first surface and a second surface, the method comprising the steps of:
providing a first surface and a second surface;
applying a filling material, having a carrier fluid and necking particles, on the first surface and/or the second surface;
providing spacer elements to define a width of a cavity between the first surface and the second surface;
bringing the first surface and the second surface together to deform the filling material such that at least one spacer element is held between the first surface and the second surface;
removing the carrier fluid such that necking particles attach in a contact region of at least one spacer element with the first surface or the second surface as to form necks;
providing a barrier section on the at least one of the first or second surface, the barrier section separating a first region and a second region on the at least one of the first or second surface;
applying a first filling material to the first region; and
applying a second filling material to the second region:
wherein the barrier section is a recess in at least one of the first surface or the second surface; and
wherein the first filling material and the second filling material include different spacer particles and/or necking particles.

13. The method of claim 12, wherein the barrier section is a protrusion on at least one of the first surface or the second surface.

14. The method of claim 12, wherein the first surface and/or the second surfaces are part of a chip, a circuit board, a solder pad, a metallization layer, a laminate, a die, a solder resist layer, a protective coating.

* * * * *